Feb. 6, 1968 F. L. BISHOP 3,368,024
GLASS SEMICONDUCTOR HOUSING HAVING ITS INTERIOR SURFACES
COVERED WITH AN ALKALI-FREE SOLDER GLASS
Filed Dec. 22, 1965

INVENTOR.
FREDERIC L. BISHOP
BY W. A. Schaich &
P. L. Sabatine
ATTORNEYS

United States Patent Office 3,368,024

Patented Feb. 6, 1968

3,368,024

GLASS SEMICONDUCTOR HOUSING HAVING ITS INTERIOR SURFACES COVERED WITH AN ALKALI-FREE SOLDER GLASS

Frederic L. Bishop, Toledo, Ohio, assignor to Owens-Illinois, Inc., a corporation of Ohio Filed Dec. 22, 1965, Ser. No. 515,667

13 Claims. (Cl. 174—52)

Figure 1:
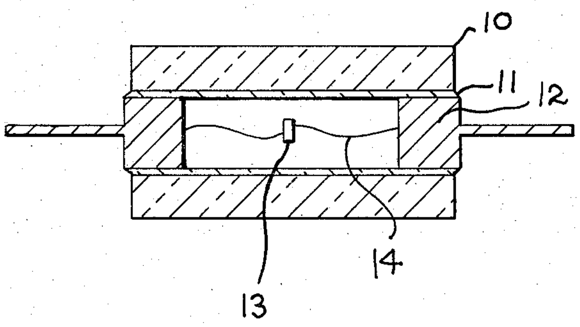

The present invention relates to laminated glass, and more particularly, to laminated glass for protecting electronic components. Specifically, the instant invention pertains to composite articles of manufacture comprising laminations of differenct glass compositions for encapsulating electronic devices.

A critical need exists in the electronic art for a means for protecting electronic equipment. This need is especially acute for suitable enclosures for encapsulating electronic components such as semi-conductors. Electronic components are often made from crystals of silicon because they possess electrical properties which make feasible extremely useful devices such as diodes, transistors, power rectifiers, and like electronic devices. The silicon crystals, employed for fabricating the above-mentioned electronic components, are often adversely effected by intimate contact with moisture or by reaction with chemicals and the like. These contacts and reaction tend to deteriorate the efficiency, life and usefulness of the electronic component or semi-conductor by dampening, crystal bridging, grounding or other like effects. It will be appreciated by those versed in the art that a means for protecting sensitive electronic components from the atmosphere, moisture, chemicals and adverse conditions would have a definite use and represent a substantial contribution to the art. Likewise, it will be further appreciated by those skilled in the art, that a means for protecting sensitive electronic components would have a positive commercial value and also increase the life and usefulness of said device.

Accordingly, it is an object of the present invention to provide a novel means for protecting electronic components.

Another object of the instant invention is to provide a novel means for protecting electronic components such as semiconductors.

Another object of the present invention is to provide a novel enclosure for encapsulating electronic components.

Still another object of the present invention is to provide a novel enclosure for electronic components to protect said components from adverse atmospheric and other conditions.

Yet another object of the present invention is to provide an enclosure for an electronic element wherein said enclosure consists of a composite article of manufacture comprising different glass compositions.

A still further object of this invention is to provide an enclosure for an electronic element having sealing properties of a normal electronic glass but having an essentially alkali-free glass surface exposed to the electronic element.

Yet a still further object of this invention is to provide an encapsulating medium for enclosing electronic devices, said medium consisting of an outer layer of a hard or high-melting-type parent glass and an inner layer of an essentially alkali-free glass.

Another object of this invention is to provide a hermetically sealed glass container, said container consisting of a glass wall tube formed from two different glass compositions, and said container enclosed at its ends by metal-alloy seals.

Yet another object of this invention is to provide a multi-shaped container comprising in combination a normally chemically resistant glass outer shell with a softer, essentially alkali-free glass inner shell, and wherein said combination is capable of being metallically sealed.

These and other objects of this invention will become apparent from the following detailed description and claims.

In attaining the objects and features of the present invention, a novel article of manufacture for encapsulating sensitive electronic elements is fabricated by laminating two different glasses. Also, the novel article of manufacture for encapsulating sensitive electronic components may be made from a relatively high melting non-metallic material, such as a ceramic, which has its interior exposed surface covered with an essentially alkali-free solder glass. The laminated article consists of an outer layer of glass in intimate contact with an inner layer of glass. The laminated glass articles may be fabricated into any desired shape, such as a tube, plate or the like. The outer or external glass layer is generally of the hard or high-melting type glass while the internal layer is an essentially alkali-free low-melting type glass. This composite lamination of glass manufacture produces multi-fold advantages for the housing and protection of sensitive electronic devices. For example, the external layer protects the housed electronic component against unfriendly atmospheric conditions and concurrently therewith moisture, it provides support and protection for the internal alkali-free glass layer, it increases the resistance of the article to shock, it assists in providing a gas-tight seal; and it offers durability and resistance to disintegrating chemical agents and other like functions. The internal layer consisting of an essentially alkali-free solder glass with its surface exposed to the electronic device also produces distinct and desirable advantages for the housing of sensitive devices. For example, the reduced moisture content of the alkali-free glass provides essential freedom from moisture in the vicinity of the device, it markedly reduces the tendency for mobile alkali-ions to diffuse and penetrate into the senitive element and react therewith in service with the inherent effects of dampening and decreased deficiency; and it also provides protection by absorbing infrared and near infrared rays and concurrently therewith decreases their detrimental effects and the like.

The laminated glass structure of the instant invention, when shaped into tubular or like form is enclosed at its ends by means of a metal or alloy seal. This seal has many distinct functions and advantages. It encloses the tube by forming a glass-to-metal seal and concurrently therewith protects the encapsulated electronic device, and it can act as a conducting enclosure. For example, inside the enclosure, a diode lead, such as gold wire, can be intimately joined to the ends of the metal seal and to the enclosed diode. Also outside the housing structure, a presheathed iron-nickel wire, a copper wire, or similar lead wire can be intimately joined to the external surface of the metal seal. Or the alloy plug can be integrally shaped into a lead-in form, shaped like a wire or rod and then producing the plug body.

The glasses employed for the external shell are commercially available glasses and are generally selected from glasses consisting of 60 to 65 weight percent $SiO_2$, 6 to 9 weight percent $Al_2O_3$, 2 to 4 weight percent $K_2O$, 2 to 4 weight percent $Na_2O$, 0.1 to 0.3 weight percent CaO, 15 to 18 weight percent $B_2O_3$, 2 to 3 weight percent BaO and 0.4 to 0.8 weight percent $Li_2O$ and from glasses consisting essentially of 55 to 60 weight percent $SiO_2$, 1 to 2 weight percent $Al_2O_3$, 7 to 10 weight percent $K_2O$, 2 to 4 weight percent $Na_2O$, 0.1 to 0.4 weight percent CaO, 0.1 to 0.4 $As_2O_3$, and 25 to 30 weight percent PbO. Illustrative of a commercially available glass composition that can be employed for the outer glass layers is a glass containing 56.3 weight percent $SiO_2$, 1.9 weight percent $Al_2O_3$, 8.9 weight percent $K_2O$, 3.5 weight percent $Na_2O$, 0.11 weight percent CaO, 0.3 weight percent $As_2O_3$ and 29.1 weight percent PbO. This glass is further characterized by a working point of 980° C., a softening point of 630° C., an annealing point of 433° C., a strain point of 400° C., an expansion coefficient (0–300° C.)$\times 10^7$°/C. of 90, and a volume resistivity of 9.9. Another acceptable glass for the external shell consists of 64.5 weight percent $SiO_2$, 7.5 weight percent $Al_2O_3$, 3.3 weight percent $K_2O$, 2.2 weight percent $Na_2O$, 0.1 weight percent CaO, 18.4 weight percent $B_2O_3$, 2.3 weight percent BaO and 0.6 weight percent $Li_2O$. This glass may be further described by its working point of 1115° C., its softening point of 710° C., its annealing point of 480° C., its strain point of 445° C. and an expansion coefficient (0–300° C.)$\times 10^7$°/C., of 47.

The glasses employed for the inner shell consist essentially of commercially available alkali-free glasses. Illustrative of essentially alkai-free glass that can be used for the purpose of this invention are the glasses selected from the group consisting of 10 to 15 weight percent $SiO_2$, 0 to 0.05 weight percent $Al_2O_3$, 15 to 18 weight percent PbO, 15 to 20 weight percent $B_2O_3$, 38 to 45 weight percent ZnO and 9 to 12 weight percent CuO; a glass consisting of 2 to 4 weight percent $SiO_2$, 2 to 4 weight percent $Al_2O_3$, 60 to 65 weight percent PbO, 15 to 20 weight percent $B_2O_3$, 7 to 10 weight percent ZnO, 2 to 3 weight percent BaO and 2 to 3 weight percent CuO; a glass composition consisting of 2 to 3 weight percent $SiO_2$, 70 to 75 weight percent PbO, 10 to 12 weight percent $B_2O_3$, 15 to 18 weight percent ZnO and 0.5 to 2 weight percent $SnO_2$; and a glass composition containing 1 to 3 weight percent $SiO_2$, 74 to 78 weight percent PbO, 7 to 10 weight percent $B_2O_3$ and 11 to 13 weight percent ZnO. As examples of commercially-available, essentially alkali-free glasses that can be used for the purpose of the present invention are the glasses selected from the group consisting of, expressed in weight percent, $SiO_2$ 13.06, $Al_2O_3$ 0.03, PbO 17.08, $B_2O_3$ 19.63, ZnO 40.15 and CuO 10.06; $SiO_2$ 2.96, $Al_2O_3$ 3.00, PbO 62.76, $B_2O_3$ 16.34, ZnO 8.97, BaO 2.97 and CuO 3.00; $SiO_2$ 2.00, PbO 71.22, $B_2O_3$ 9.95, ZnO 15.83, and $SnO_2$ 1.00; and $SiO_2$ 2.00, PbO 76.32, $B_2O_3$ 8.84 and ZnO 12.84.

The commercially-available metals that can be used for sealing the ends of the shaped laminated glass encapsulating article and for use as a lead-in wire are generally alloys comprising nickel, cobalt, copper, iron manganese, tungsten, and the like. These alloys include the alloy Kovar consisting of about 29 percent nickel, 17 percent cobalt, 0.3 percent manganese and the balance iron; Sylvania No. 4 alloy consisting of 42 percent nickel, 5.5 percent chromium and the balance iron; the alloy sold under the trade name Fernico consisting of 54 percent iron, 28 percent nickel and 18 percent cobalt, the alloy sold under the trade name Dumet containing a copper-coated composition of 45 percent nickel and 55 percent iron and like alloys.

The composite laminated glass structure of the instant invention can be manufactured by various but known techniques. For example, if the presently desired shape is tubular, the soft, essentially alkali-free glass can be in tube form and sized to fit into the hard outer glass tubing with both being redrawn together by techniques known to the art; or, the soft, alkali-free glass may be coated as a slurry on the inside of a hard glass tubing to be redrawn, much as fluorescent tubes are phosphor-coated so that during the redraw the soft glass will melt to a continuous layer; or for shapes other than tubular, other layering or coating means, such as screen printing, electrostatic printing, spraying or the like may be employed.

The metal-end seals, when applied to the tubular ends of the laminated article can be made by the various metal-to-glass seal techniques known to the art. The inner soft glass can simply be heated by infrared light, by an oxyhydrogen torch or other suitable means and the metal seal joined to the glass. The seal may also be effected by bead, vehicle, dipping or by other art known techniques.

The above and following description and examples are merely representative of the invention and are not to be construed as limiting the invention as these and other methods will be obvious from the instant disclosure to those skilled in the art.

*Example I*

A four foot length glass tube having an outside diameter of one inch and an inside diameter of about 0.65 inch was coated on its inside surface with an essentially alkali-free glass. The glass tube was of the hard type glass and the glass composition contained, expressed in parts by weight, about 56.3 of $SiO_2$, about 1.9 $Al_2O_3$, about 8.9 $K_2O$, about 3.5 $Na_2O$, about 0.11 CaO, about 0.3 $As_2O_3$, and about 29.1 PbO.

The essentially alkali-free frit containing, expressed in parts by weight, about 2.90 $SiO_2$, about 3.00 $Al_2O_3$, about 62.76 PbO, about 16.34 $B_2O_3$, about 8.97 ZnO, about 2.97 BaO and about 3.00 CuO, was mixed with a nitrocellulose in amyl acetate vehicle to a thin consistency and poured into the open end of the above-described tube. The open end was next sealed and the tube was rotated until the interior appeared uniformly coated. Both ends of the tube were opened and the excess material was allowed to drain until the surface was completely dry. The process was repeated to insure complete and uniform coating of the interior surface of the hard tube. After the second coating was applied, the tube was allowed to drip dry and air cured overnight.

Finally, the inside coated tube was heated and redrawn in a continuous type furnace, at a temperature of about 1200° F., or slightly higher than the fiber softening point of the hard outside tube. This heating step intimately laminated the alkali-free glass to the inside wall of the outer tube.

*Example II*

A glass-to-metal seal may be conveniently effected by employing a metal alloy in the shape of a plug to be inserted into the composite tube. Of course, the plug may have a lead-in wire fused to its external side, or it may have a stem leading therefrom to serve as a lead-in connector. Generally, a circular plug of Dumet, with a central stem, is inserted into the tube ends and the tube is then rapidly heated in the immediate area of the plug to fuse the laminated glass to the plug to produce the glass-to-metal seal.

Figure 2:
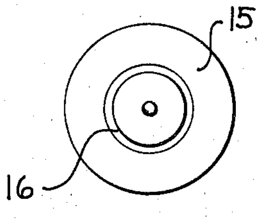

In the drawings, FIGURE 1 illustrates a cross-section of an encapsulating housing for a solid-state electronic component, the sealed enclosure consists of a hard base glass 10, an essentially alkali-free glass 11, an alloy plug 12, a diode 13 and a diode lead 14; and, in FIGURE 2, the cross-section depicts a hard tube 15 with an essentially alkali-free coating at 16.

The terms "soft" and "hard" as used herein indicate low and high softening temperatures. See E. B. Shand, "Glass Engineering Handbook," second edition, published by McGraw-Hill Book Co., 1958, at page 39.

While the illustrative embodiments of the invention have been described with particularity, it will be understood that various modifications will be apparent and can readily be made by those skilled in the art without departing from the scope and spirit of the invention.

What is claimed is:

1. An article of manufacture comprising an encapsulating envelope for electronic components wherein said envelope consists of a rigid hollow body portion of a relatively high melting non-metallic material and wherein the interior exposed surface of said body portion consists of an essentially alkali-free glass selected from the group of glasses consisting of 10 to 15 weight percent $SiO_2$, 0 to 0.05 weight percent $Al_2O_3$, 15 to 18 weight percent PbO, 15 to 20 weight percent $B_2O_3$, 38 to 45 weight percent ZnO, and 9 to 12 weight percent CuO; a glass consisting of 2 to 4 weight percent $SiO_2$, 2 to 4 weight percent $Al_2O_3$, 60 to 65 weight percent PbO, 15 to 20 weight percent $B_2O_3$, 7 to 10 weight percent ZnO, 2 to 3 weight percent BaO and 2 to 3 weight percent CuO; a glass consisting of 2 to 3 weight percent $SiO_2$, 70 to 75 weight percent PbO, 10 to 12 weight percent $B_2O_3$, 15 to 18 weight percent ZnO, and 0.5 to 2 weight percent $SnO_2$; and a glass consisting of 1 to 3 weight percent $SiO_2$, 74 to 78 weight percent PbO, 7 to 10 weight percent $B_2O_3$, and 11 to 13 weight percent ZnO.

2. An article of manufacture according to claim 1 wherein said alkali-free glass consists of about 13.1 weight percent $SiO_2$, about 0.03 weight percent $Al_2O_3$, about 17.1 weight percent PbO, about 19.6 weight percent $B_2O_3$, about 40.2 weight percent ZnO, and about 10.1 weight percent CuO.

3. An article of manufacture according to claim 1 wherein said alkali-free glass consists of about 3 weight percent $SiO_2$, about 3 weight percent $Al_2O_3$, about 63 weight percent PbO, about 16.4 weight percent $B_2O_3$, about 9 weight percent ZnO, about 3 weight percent BaO and about 3 weight percent CuO.

4. An article of manufacture according to claim 1 wherein said alakali-free glass consists of about 3 weight percent $SiO_2$, about 71.2 weight percent PbO, about 10 weight percent $B_2O_3$, about 15.8 weight percent ZnO, and about 1 weight percent $SnO_2$.

5. An article of manufacture according to claim 1 wherein said alkali-free glass consists of about 2 weight percent $SiO_2$, about 76.3 weight percent PbO, about 8.8 weight percent $B_2O_3$, and about 12.8 weight percent ZnO.

6. An article of manufacture according to claim 1 wherein said non-metallic material is a relatively high melting glass selected from the group of glasses consisting of 60 to 65 weight percent $SiO_2$, 6 to 9 weight percent $Al_2O_3$, 2 to 4 weight percent $K_2O$, 2 to 4 weight percent $Na_2O$, 0.1 to 0.3 weight percent CaO, 15 to 18 weight percent $B_2O_3$, 2 to 3 weight percent BaO, and 0.4 to 0.8 weight percent $Li_2O$; and a glass consisting of 55 to 60 weight percent $SiO_2$, 1 to 2 weight percent $Al_2O_3$, 7 to 10 weight percent $K_2O$, 2 to 4 weight percent $Na_2O$, 0.1 to 0.4 weight percent CaO, 0.1 to 0.4 weight percent $As_2O_3$, and 25 to 30 weight percent PbO.

7. An article of manufacture according to claim 6 wherein said high melting glass consists of about 56.3 weight percent $SiO_2$, about 1.9 weight percent $Al_2O_3$, about 8.9 weight percent $K_2O$, about 3.5 weight percent $Na_2O$, about 0.1 weight percent CaO, about 0.3 weight percent $As_2O_3$, and about 29.1 weight percent PbO.

8. An article of manufacture according to claim 6 wherein said high melting glass consists of about 64.5 weight percent $SiO_2$, about 7.5 weight percent $Al_2O_3$, about 3.3 weight percent $K_2O$, about 2.2 weight percent $Na_2O$, about 0.1 weight percent CaO, about 18.4 weight percent $B_2O_3$, about 2.3 weight percent BaO, and about 0.6 weight percent $Li_2O$.

9. An article of manufacture comprising a cylindrical piece of hard glass with a cylindrical internal lining of an essentially alkali-free solder glass, said cylindrical member being closed at its ends by a pair of metal-alloy plugs to which are integrally formed lead-in wires, and within the enclosure thus formed a solid state electronic component positioned with a pair of leads extended therefrom and connected to the inside surface of the alloy plugs.

10. An article of manufacture according to claim 9 wherein the hard glass is a member selected from the group of glasses consisting of about 56.2 weight percent $SiO_2$, about 1.9 weight percent $Al_2O_3$, about 8.9 weight percent $K_2O$, about 3.5 weight percent $Na_2O$, about 0.1 weight percent CaO, about 0.3 weight percent $As_2O_3$, and about 29.1 weight percent PbO; a glass consisting of about 64.5 weight percent $SiO_2$, about 7.5 weight percent $Al_2O_3$, about 3.3 weight percent $K_2O$, about 2.2 weight percent $Na_2O$, about 0.1 weight percent CaO, about 18.4 weight percent BaO and about 0.6 weight percent $Li_2O$.

11. An article of manufacture according to claim 9 wherein the essentially alkali-free solder glass is a member selected from the group of glasses consisting of a glass containing about 13.1 weight percent $SiO_2$, about 0.03 weight percent $Al_2O_3$, about 17.1 weight percent $B_2O_3$, about 40.2 weight percent ZnO, and about 10.1 weight percent CuO; a glass consisting of about 0.3 weight percent $SiO_2$, about 3 weight percent $Al_2O_3$, about 63 weight percent PbO, about 16.3 weight percent $B_2O_3$, about 9 weight percent ZnO, about 3 weight percent BaO, about 3 weight percent CuO; a glass consisting of about 3 weight percent $SiO_2$, about 71.2 weight percent PbO, about 10 weight percent $B_2O_3$, about 15.8 weight percent ZnO, and about 1 weight percent $SnO_2$; and a glass consisting of about 2 weight percent $SIO_2$, about 76.3 weight percent PbO, about 8.8 weight percent $B_2O_3$ and about 12.8 weight percent ZnO.

12. An article of manufacture according to claim 11 wherein said alloy plug consists essentially of alloys chromium and iron, an alloy consisting of nickel, cobalt manganese and iron, an alloy consisting of nickel, chromium and iron, an alloy consisting of nickel, cobalt and iron and an alloy containing nickel and iron.

13. An article of manufacture comprising an encapsulating envelope for electronic components wherein said envelope consists of a rigid hollow body portion of a relatively high melting non-metallic material and wherein the interior exposed surfaces of said body portion are coovered with an essentially alkali-free solder glass.

References Cited

UNITED STATES PATENTS 3,061,664 10/1962 Kegg.
3,171,187 3/1965 Ikeda et al.
3,311,800 3/1967 Bakalar.

LARAMIE E. ASKIN, *Primary Examiner.*